United States Patent
Roth (10) Patent No.: US 6,448,806 B1
(45) Date of Patent: Sep. 10, 2002

(54) CIRCUIT FOR PROVIDING A LOGICAL OUTPUT SIGNAL IN ACCORDANCE WITH CROSSING POINTS OF DIFFERENTIAL SIGNALS

(75) Inventor: Bernhard Roth, Boeblingen (DE)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/957,922

(22) Filed: Sep. 21, 2001

(30) Foreign Application Priority Data

Nov. 24, 2000 (EP) .............................................. 00125758

(51) Int. Cl.[7] .............................................. H03K 19/00
(52) U.S. Cl. .............................. 326/16; 326/14; 326/82
(58) Field of Search ............................... 326/9, 14, 16, 326/82; 327/307, 65, 563

(56) References Cited

U.S. PATENT DOCUMENTS

| | | | |
|---|---|---|---|
| 6,016,566 A | 1/2000 | Yoshida | 714/736 |
| 6,281,699 B1 * | 8/2001 | Bishop | 324/765 |
| 6,377,073 B1 * | 4/2002 | Krasnansky | 326/82 |

OTHER PUBLICATIONS

Feuer, F. European Search Report, Application No. EP 00 12 5758, dated Apr. 25, 2001.

* cited by examiner

Primary Examiner—Michael Tokar
Assistant Examiner—Anh Tran (57) ABSTRACT

A circuit provides an output signal in accordance with crossing points of a differential signal, which includes a normal input signal and a complementary input signal. The circuit includes a first amplifier for amplifying a first signal difference between the normal input signal and a first threshold value, and for providing as a first output signal the amplified first signal difference. The circuit includes a second amplifier for amplifying a second signal difference between the complementary input signal and a second threshold value, and for providing as a second output signal the amplified second signal difference. The circuit also includes a first comparator for providing a first logical level when a third signal difference between the first output signal and the second output signal is greater than a third threshold value, and for providing a second logical level when the third signal difference is smaller than the third threshold value.

8 Claims, 12 Drawing Sheets

CIRCUIT FOR PROVIDING A LOGICAL OUTPUT SIGNAL IN ACCORDANCE WITH CROSSING POINTS OF DIFFERENTIAL SIGNALS

BACKGROUND OF THE INVENTION

The present invention relates to circuits for providing a logical output signal in accordance with crossing points of differential signals. Circuits of that kind can be advantageously used, for example, at a front end of an automatic test equipment (ATE). In such ATE environment, output signals of the devices under test (DUT) may be single-ended as well as differential type signals.

The value of an ATE for the user is dependent on many different factors. Two of them are universality in the meaning of how many different parts and/or different signal types can be tested, and performance in the meaning of speed and accuracy of gaining the testing results.

Regarding the circuits which are supposed to receive DUT generated signals, a problem occurs if DUTs which have single-ended signals (signals which need only one pin for exit to the ATE) should be tested on the same testing equipment as DUTs which provide differential signals (signals which need two pins where one pin represents the normal logic output level and the other pin represents the complementary logic output level).

For a clear understanding of the following drawings and description of the invention it is advisable to set forth the conventions used below.

Figure 1A:
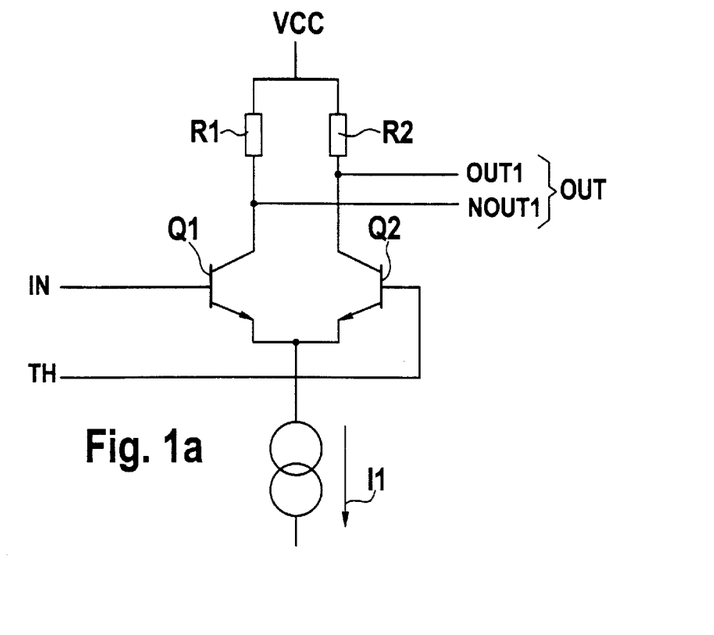
FIGS. 1a–1c a simplified circuit diagram and block diagrams of symbolic representations of a comparator, FIG. 2 a block diagram of comparators used for handling single-ended as well as differential signals, FIG. 3 a pulse/time diagram of the input and output pulses of the comparators of FIG. 2 occurring during operation, FIGS. 4a–4c different circuit arrangements of comparators for handling single-ended as well as differential signals, FIG. 5 a representation of the basic idea of the invention, FIGS. 6a–6c block diagrams and a pulse/time diagram showing the input and output pulses during operation of an example of the invention, FIGS. 7a–7f block diagrams of various circuit arrangements for performing single-ended as well as differential compare operations according to the invention, FIG. 8 a circuit diagram which represents an implementation of the circuit arrangement of FIG. 7c, FIG. 9 a modified circuit diagram of FIG. 7c for equal level logic output signals in single-ended and differential mode, FIG. 10 a circuit diagram which represents an implementation of the circuit arrangement of FIG. 7e, FIG. 11 a simplified block diagram for representing the latch function used in high-speed comparators, FIG. 12 a circuit diagram with latch function incorporated, FIG. 13 a pulse/time diagram which shows the various input, control and output signals of the circuit arrangement of FIG. 12 occurring during operation, and FIG. 14 a circuit diagram which represents an implementation of the circuit arrangement of FIG. 7d with supplemented latch function.

FIG. 1a shows a basic circuit drawing of a comparator as used e.g. in ATE systems. It is essentially a symmetrical differential amplifier formed of transistors Q1 and Q2. This simple symmetrical differential amplifier basically provides two output signals: a normal and a complementary signal.

Figure 1B:
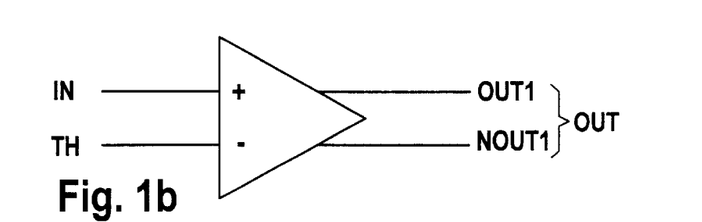
Figure 1C:
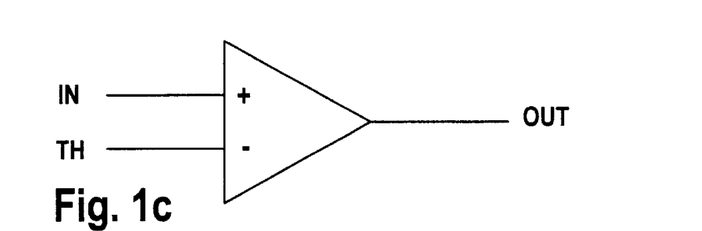

The input signal IN to Q1 is compared with a threshold value TH applied to Q2. The result is a normal signal OUT1 developed from Q2, and a complementary signal NOUT1 from Q1. Since both physical signals represent the same information content (a logical 0 means always that OUT1=low and NOUT1=high) it is sufficient and mostly used in symbolic representations and block diagrams to show, as depicted in FIGS. 1b and 1c, only one output line OUT instead of OUT1 and OUT2. The line OUT quite commonly represents the polarity of the normal signal and accordingly always behaves like OUT1.

Figure 2:
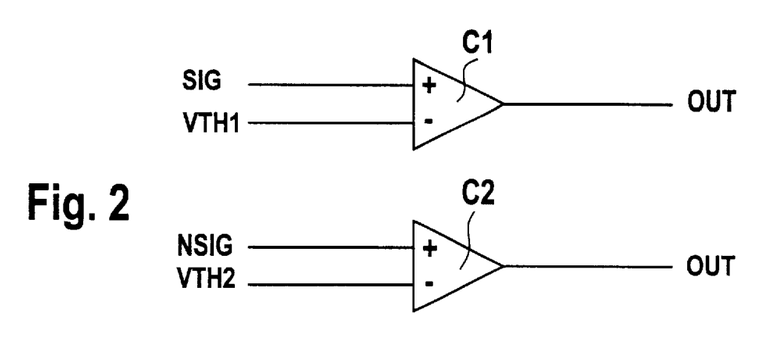

Most of the present ATEs can only operate on single-ended signals and up to now only a few can handle differential signals. Currently used concepts for handling differential signals by single-ended ATEs are using two single-ended comparators C1 and C2, as shown in FIG. 2, where the threshold voltages VTH1 for C1 and VTH2 for C2 are set to the same level, usually 50% of the logic levels. In this example, SIG represents the input signal from the DUT to the ATE having the normal signal level and NSIG the complementary level.

A major disadvantage of this concept is the timing inaccuracy that occurs when the zero crossing point of the signals SIG–NSIG is not at the same zero crossing point of (SIG–VTH) and/or (NSIG–VTH).

Figure 3:
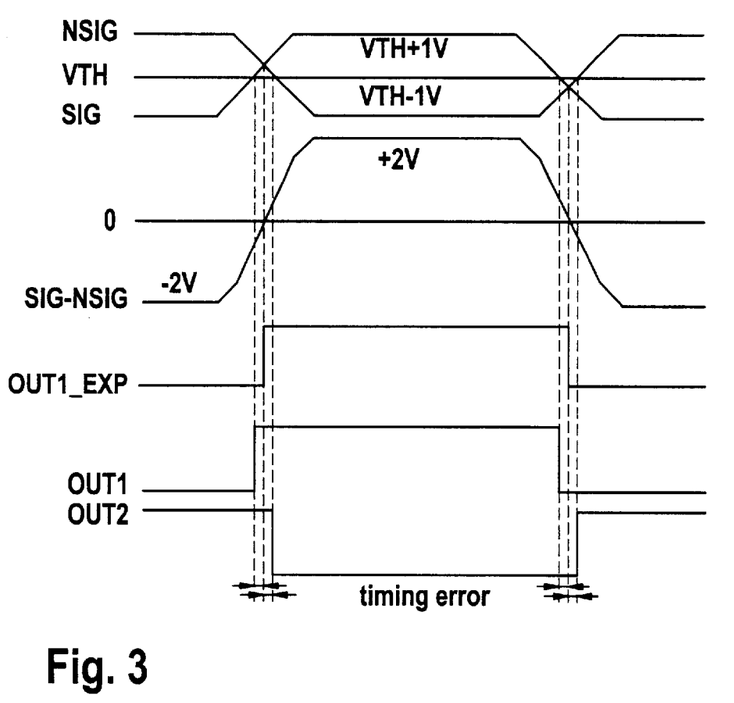

Timing errors which result from even minimally delayed zero crossings are represented in FIG. 3, which shows that the output signals OUT1 of C1 and OUT2 of C2 are out of phase. The leading and trailing edges of both, OUT1 and OUT2, are shifted compared to the correct point in time, represented by the vertical dash line in the middle between the outer dash lines. The calculated signal curve (SIG–NSIG) shows the real signal crossing of SIG and NSIG. Derived from that curve, an expected timing-error free output signal OUT1_EXP is also represented in FIG. 3. The real zero crossings of NSIG/VTH and of SIG/VTH represent the outer dash lines, and they show at the bottom line of this figure the timing errors of OUT1 and OUT2 versus the real zero crossing of (SIG–NSIG). From this it is clear that further processing of inaccurate DUT signals by an ATE leads to measurement errors which in most cases can not result in a reliable estimation of the tested DUT.

It is noted that the shown phase shift is just one example of a situation where the crossing point between signals SIG and NSIG are not at the middle between the high and low level. Other situations can be, for example, different swings, levels, or transition times.

Figure 4A:
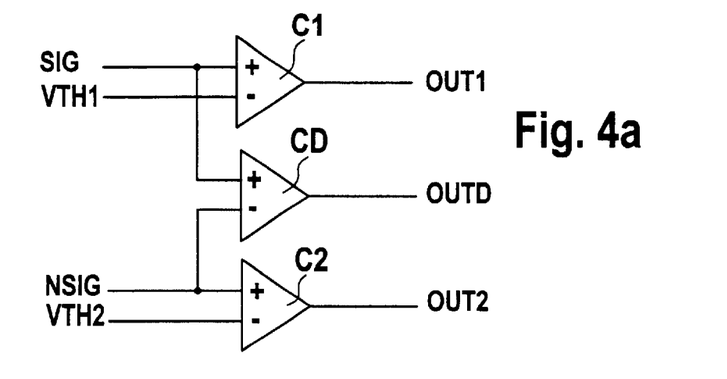
Figure 4B:
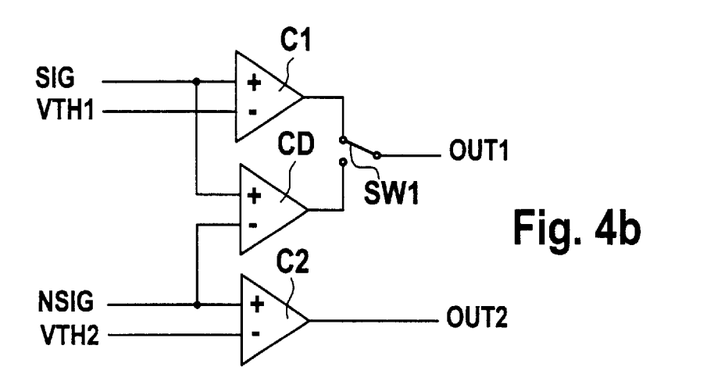
Figure 4C:
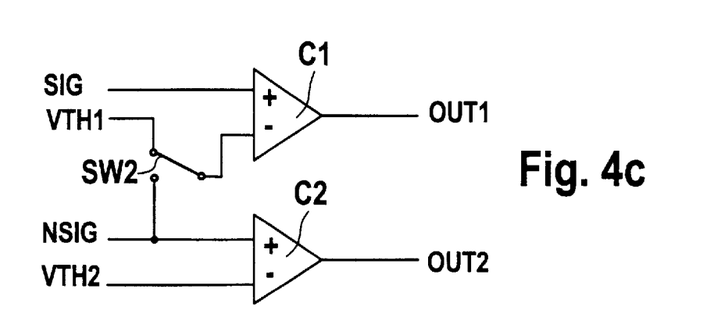

Therefore, different approaches have been discussed, which are shown in FIGS. 4a–4c. Some ATEs with the capability of handling both alternatives may use two single-ended comparators C1, C2 and one differential comparator D having a separate output line OUTD. The input line of the differential comparator D for the normal signal level is connected to the line carrying the differential signals SIG with the normal logic level at the input of C1, and the input line of D for the complementary signal level is connected to the line with the differential signals NSIG at the input of C2. The implementation of FIG. 4a suffers from the fact that there is an extra line required for the differential comparator output OUTD.

In order to reduce the output line expenditure, it is shown in the example of FIG. 4b that OUTD can be replaced by OUT1, however, by adding a switch SW1 which connects OUT1 either to the output of C1 or to the output of D, so that lines originally used for single-ended applications now serve differential applications.

FIG. 4c shows another alternative, where a switch SW2 can be used to route either one threshold voltage VTH1(2) or the complement signal NSIG (normal signal SIG) to one of the comparators C1(C2), dependent on whether SW2 is inserted into the VTH1 line to C1 or the VTH2 line to C2. FIG. 4c further shows the circuit modifications for C1: SW2 is only connected to C1, so that when in the single-ended mode SW2 connects C1 to threshold voltage VTH1, and when in differential mode SW2 connects C1 to NSIG at the input of C2.

The approaches according to FIGS. 4a and 4b have significant disadvantages in that each incoming signal line is loaded by an additional comparator that is not used when single-ended applications are run by the ATE. In these cases the differential comparator D represents a parasitic load. On the other hand, when the ATE is running differential applications the single-ended comparators C1 and C2 contribute to parasitic signal distortions. This has a negative impact on the ATE performance, because any incoming signal is delayed and frequency-limited due to parasitic capacitances on the input lines of the comparators. As a further disadvantage the fact can be regarded that the above-described approaches need considerably more electrical power and more silicon space for implementation. Furthermore, the solution shown in FIG. 4c is not useful for high-speed applications, because signals transferred via switches become distorted per se and provide signal delays and other distortions by themselves.

These above problems, however, can be solved by using two different dedicated ATEs or one ATE with different, dedicated plug-in printed circuit cards with pin dedicated electronic circuitry. Both solutions, however, again have severe disadvantages, like higher cost, extra floor space, and restrictions in universality of channel usage by the ATE.

SUMMARY OF THE INVENTION

It is an object of the invention to provide an improved circuit for providing a logical output signal in accordance with crossing points of differential signals.

These objects of the invention are solved by the independent claims. Preferred embodiments are shown by the dependent claims.

The circuit structure of the invention thus allows that two single-ended comparators are combined to a differential comparator without adding parasitic components to the measurement node of an ATE to which it is connected and therefore without causing a negative impact on the bandwidth of the ATE's input channels. The number of additional components needed for the combining circuitry of the comparators as well as the additional current can also be minimal.

It is clear that the invention can be partly or entirely realized by suitable software subroutines or programs, which can be executed by a suitable data processing unit incorporated e.g. in the ATE controller circuitry.

It is also apparent that although described herein for the example of ATE applications, the invention is not limited thereto but can be applied wherever logical output signals in accordance with crossing points of different signals have to be provided.

BRIEF DESCRIPTION OF THE DRAWINGS

Other objects and many of the attendant advantages of the present invention will be readily appreciated and become better understood by reference to the following detailed description when considering in connection with the accompanied drawings. Features that are substantially or functionally equal or similar will be referred to with the same reference sign(s). The drawings show in.

DETAILED DESCRIPTION OF THE INVENTION

The new idea on which the invention is based takes advantage of the fact that almost all comparing circuits (or comparators) consist of more than one amplifier stage where the first stage due to its relative low amplification provides a significant wide linear region in its steady-state characteristic (characteristic curve).

Figure 5:
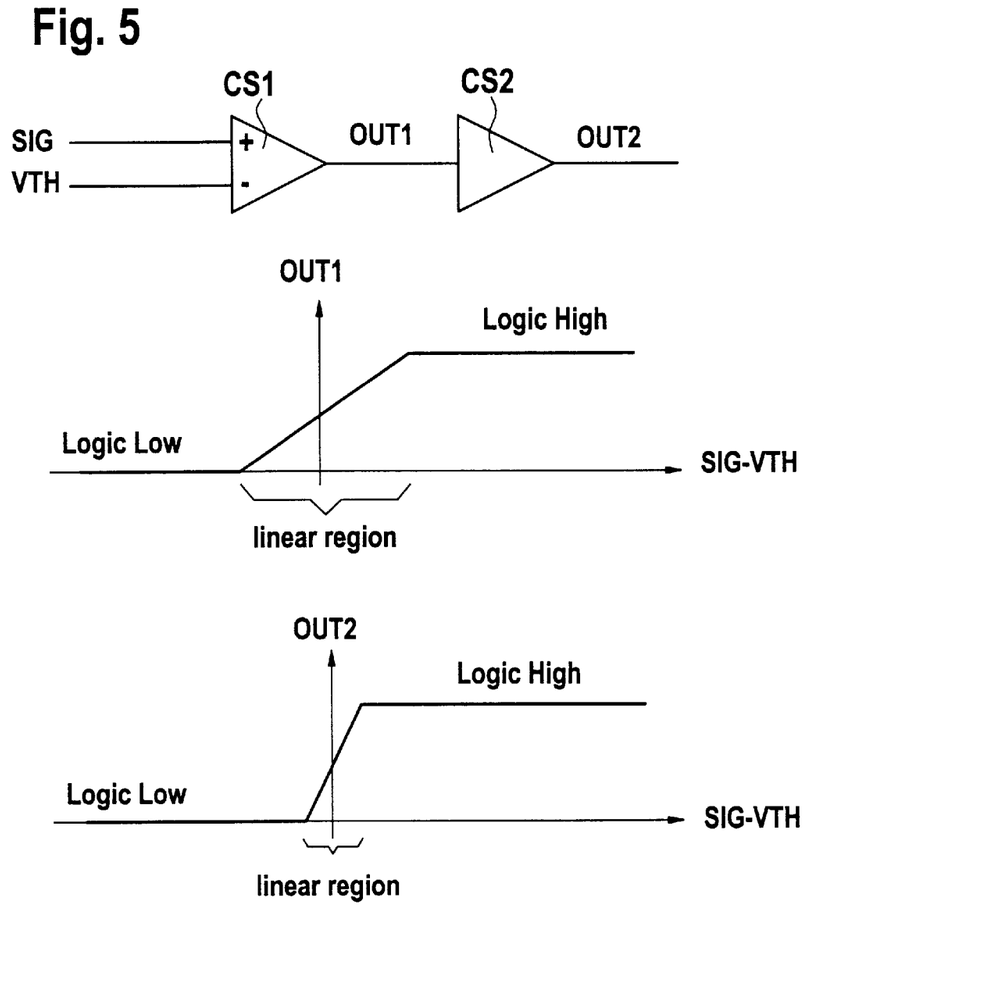

FIG. 5 shows the basics of the invention. Two amplifier stages CS1 and CS2 of a comparator, e.g. C1 of FIG. 2, are shown in FIG. 5. The same subdivision into at least two stages of the amplifier stages could also be made with comparator C2 which, however, is not shown in FIG. 5. The level transition of signal SIG from logic low to logic high proceeds widely linear as can be seen on the (SIG–VTH) time axis in FIG. 5. The output signal out1 of the first stage CS1, derived from the linear region, properly biased into the middle of the linear region, will be transferred to the second stage CS2 having a similar amplification factor. This means that due to the added amplification of the second stage CS2 the linear region with respect to the input signal gets smaller, an effect which continues with any subsequent amplification stage.

For providing best results with circuits of the invention, it is recommended that the level where the zero crossings of (SIG–NSIG) occur is within the linear region of the first stage(s). Since most of the DUTs that require differential testing are using low signal swings in the range of 1 Volt or less this condition is met in almost all cases.

Figure 6A:
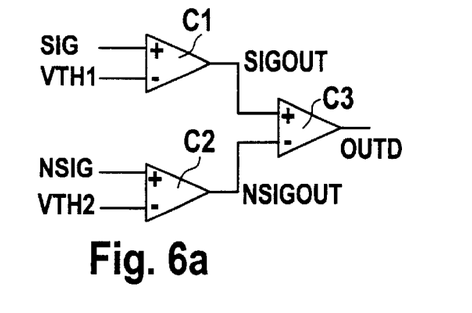

The general idea of the invention is shown in block-diagrammatic form in FIG. 6a, which can be understood as a differential comparator split internally into a first and a second stage. The wide linear region of the first stages in each comparator C1, C2 is used to generate the signals SIGOUT (OUT1) of comparator C1 and NSIGOUT (OUT2) of comparator C2 after the first stage(s) which are fed to a third comparator C3 performing the final comparison by generating a sum signal (SIGOUT–NSIGOUT) relative to the VTH3 level (mostly set to 0V) of the circuitry, resulting in signal OUTD.

It should be noted that C1 and C2 in FIG. 6a each represent a first stage for performing subsequently a subtraction, C3 represents all further stages (2, 3, . . . ), and C1, C2 and 3 together form a comparator circuit.

Figure 6B:
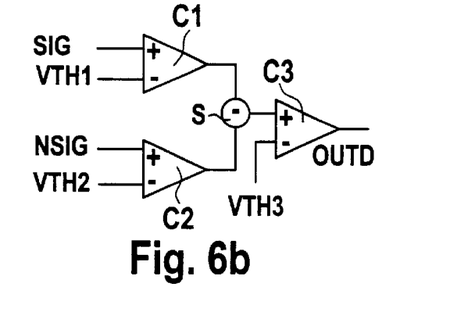

For better understanding of FIGS. 7a–7f, the subtractor function S is shown in FIG. 6b as a separate function forming the difference of the signals SIGOUT–NSIGOUT. The sum signal is then related to the VTH3=0V level of the circuitry by comparator C3. As usual for handling differential signals by the comparators the threshold voltages VTH are again set to VTH=VTH1=VTH2.

Figure 6C:
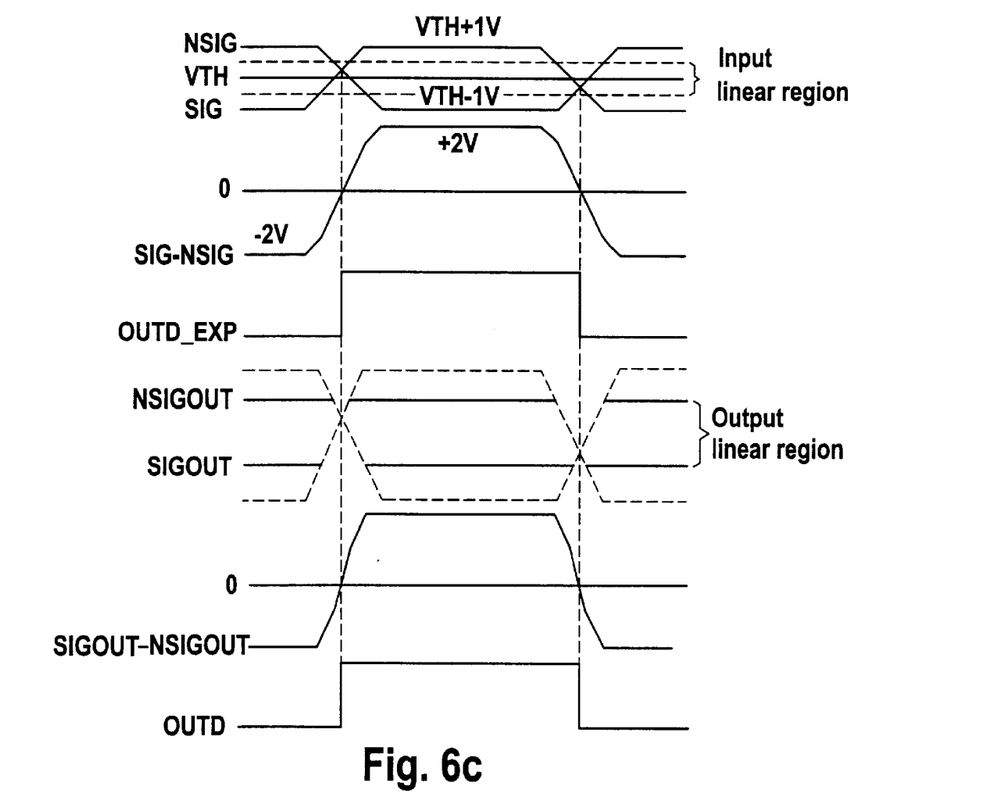

The single phases of how the result of an error free output signal OUTD is produced are shown in FIG. 6c. The first six lines from above are similar to those shown in FIG. 3: The zero crossing of the signals NIG/SIG occurs at the same time as the zero crossing of SIG–NSIG with the zero voltage line.

This means that the expected signal OUTD_EXP is in phase with the SIG/NSIG crossing. The signal lines below the sixth line demonstrate how the invention uses the broad output linear region to generate the signals NSIGOUT and SIGOUT. These signals are fed to a subtractor S which forms the difference signal SIGOUT–NSIGOUT and which signal is transferred to comparator C3 for performing the final comparison. This results in the desired error free differential output signal OUTD.

A large variety of implementations of the basic idea of the invention is shown in FIGS. 7a–7f. The gist of the invention, however, covers even more circuit structures which might be evident to those having ordinary skill and baring in mind the basic idea of the invention, namely using the broader (substantially) linear region of the first amplifier stage of single-ended comparators for making the signal subtraction.

Figure 7A:
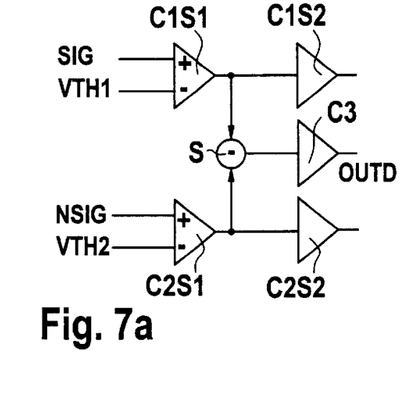

Starting with the block diagram of FIG. 7a which is quite similar to FIG. 6a, it can be seen that the tapping points for the subtractor S are chosen between the first stage C1S1 having low amplification and the second stage C1S2 of comparator C1 and between the first stage C2S1 having equally low amplification and the second stage C2S2 of comparator C2. The difference signal SIGOUT–NSIGOUT is derived by subtractor S (please refer to FIG. 6a) and fed to differential comparator C3 which generates the timing error free differential output signal OUTD (reference should also be made to FIGS. 1a–1c).

Figure 7B:
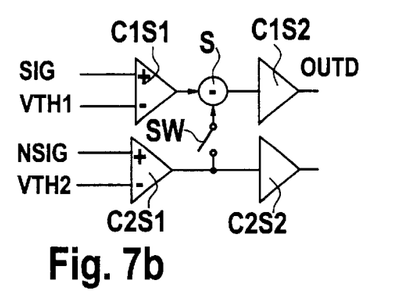

If a switch SW is added and the subtractor S is inserted between C1S1 and C1S2, as shown in FIG. 7b, C3 of FIG. 7a is not needed anymore.

Figure 7C:
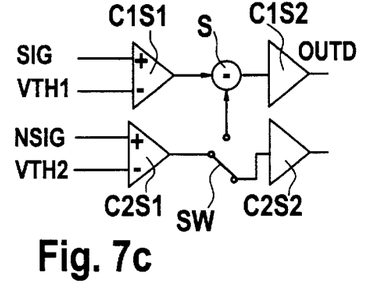

The structure of FIG. 7c differs from FIG. 7b in so far as two-position switch SW is used to connect the connecting line between C2S1 and C2S2 either to subtractor S or to C2S2. When in differential mode (SW in the up position), C1S2 provides the error free differential output signal OUTD. When SW is in the down position the whole circuit functions as two independent single-ended comparators.

Figure 7D:
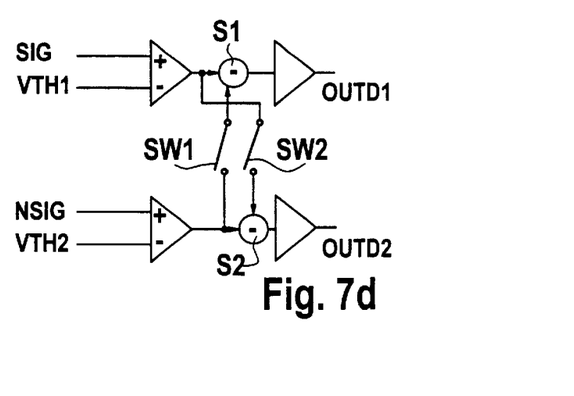

Another alternative shows FIG. 7d. Two subtractors S1 and S2 and two switches SW1 and SW2 are used to either generate OUTD by C1S2 (when SW1 is closed and at the same time SW2 is open) or by C2S2 (when SW1 is open and SW2 is closed) or by C1S1 and C2S2 (when SW1 and SW2 are closed).

Figure 7E:
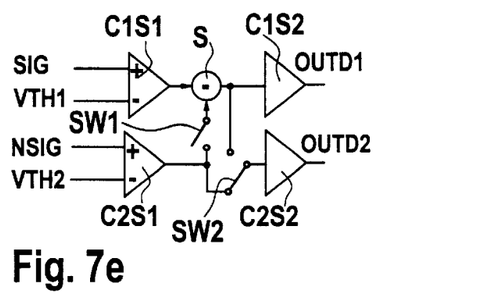

The block diagram of FIG. 7e uses only one subtractor S and switches S1 and S2, with S2 being a two-position switch. Similar to the arrangement in FIG. 7d this comparator can generate the timing error free differential signal OUTD either by C1S2 or both. In the first case SW1 is closed and SW2 is in the down position where it connects C2S1 with C2S2. In the second case SW1 is closed again and SW2 is in the up position where it connects the output of S to C2S2. For single-ended operations SW1 is open and SW2 in the down position.

Figure 7F:
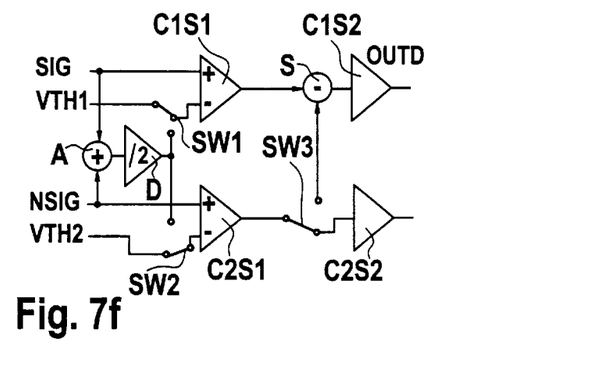

In FIG. 7f a block arrangement is shown for applications where the input signals SIG and NSIG are allowed to have floating levels. For compensation purposes both signals are added in adder A and the sum signal is subsequently divided by two in divider D. Two-position switches SW1 and SW2 are used to feed in case of floating level input signals this averaged signal (SW1 in down and SW2 in up position) to C1S1 and C2S1 instead of the threshold voltages VTH1 and VTH2. In case of non-floating input signals, switches SW1 is in the up and SW2 is in the down position where the threshold voltages are applied to C1S1 and C2S1. Further signal processing may be as shown in FIG. 7c where SW has the same function as SW3.

The above-described floating threshold approach can also be applied to the circuits shown in FIGS. 7a, 7b, 7d, and 7e.

Figure 8:
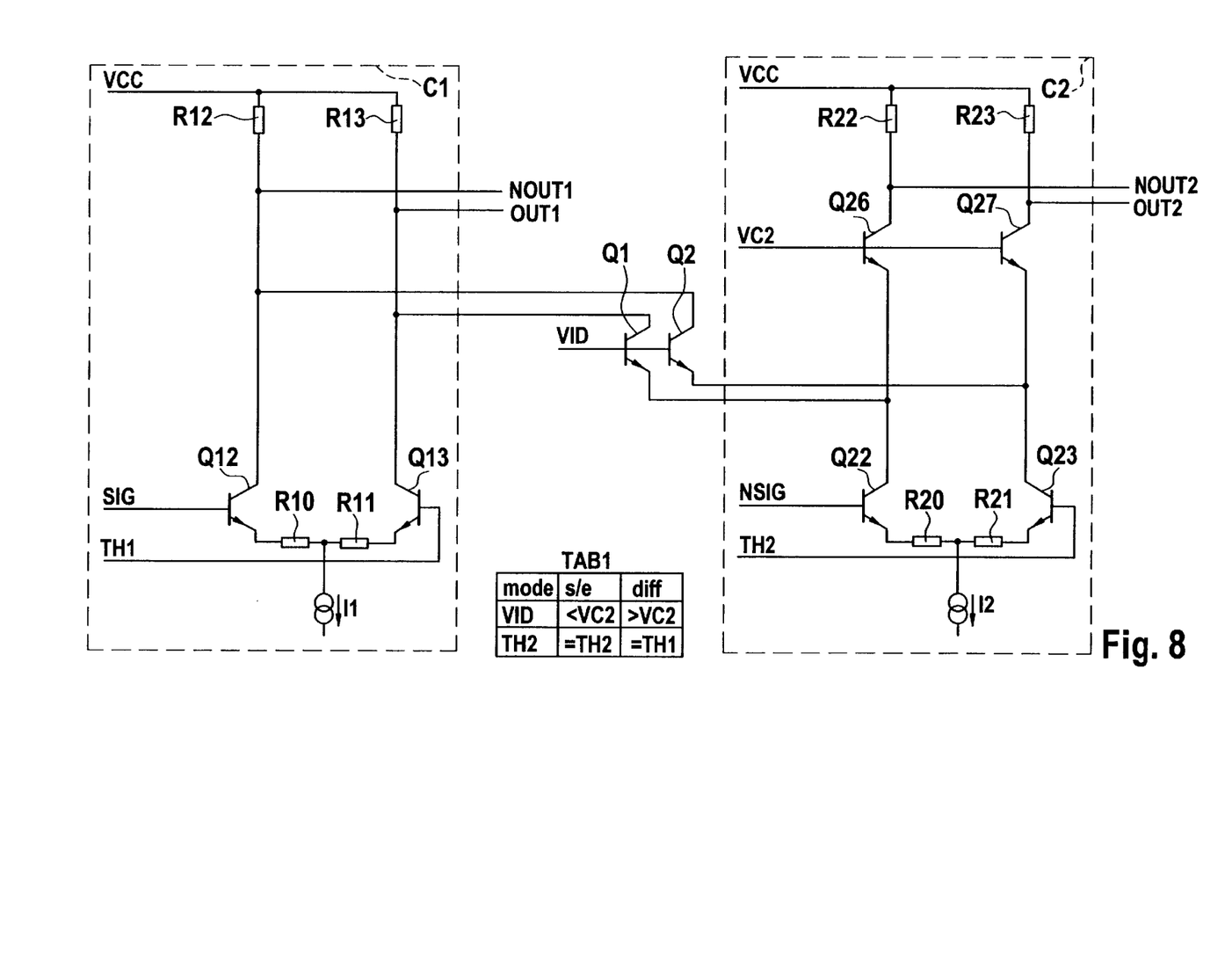

A simple circuit arrangement according to FIG. 7c, realized with NPN-transistors is depicted in FIG. 8. The linear region which is important for generating the timing error free differential output signals OUT1/NOUT1 (OUTD in FIG. 7c) and OUT2/NOUT2 is basically defined by current I1, derived from a current source, flowing through comparator C1 and resistors R10 and R11. In case of comparator C2 the linear region is basically defined by I2, also derived from a current source and R20 and R21. Switch SW is realized by transistors Q1, Q2, Q26 and Q27 and subtractor S by the currents flowing through Q22, Q1 to OUT1 and through Q13 to OUT1, as well as through Q23, Q2 to NOUT1 and through Q12 to NOUT1. The difference of both partial currents is resulting in SIGOUT–NSIGOUT. Table TAB1 at the bottom of FIG. 8 shows the various relationships between the involved nodes and components of the comparators dependent on the mode of operation: single-ended or differential. The mode control element is voltage VID which when sufficiently smaller than voltage VC2 defines together with TH2=TH2 the single-ended mode and when sufficiently greater than VC2 together with TH2=TH1 the differential mode of operation.

Figure 9:
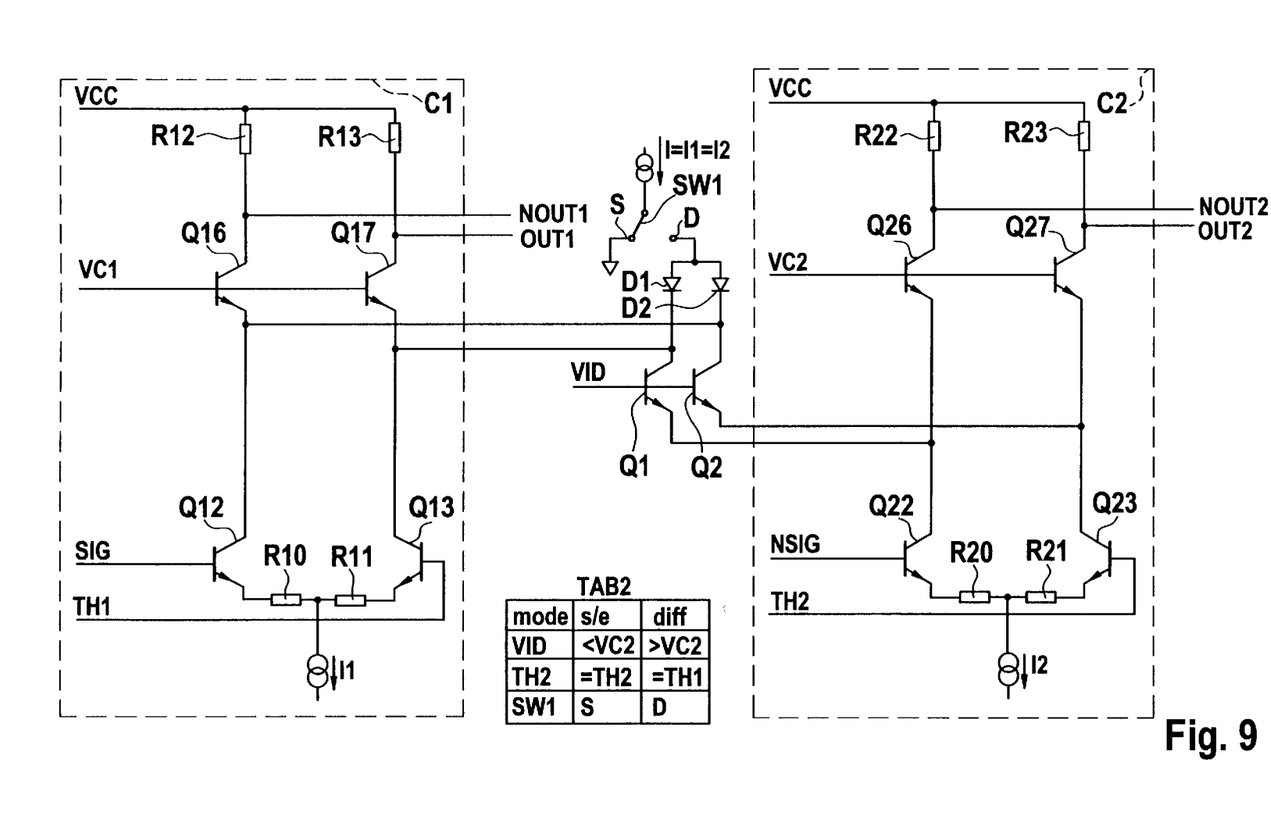

As the logic levels are different in this circuitry when in single-ended or in differential mode this could present a problem to subsequently connected circuits. In order to have the same logic levels in both the single-ended or the differential mode of operation, the cascodes Q16 and Q17 (FIG. 9) along with diodes D1 and D2 and two-position switch SW1 are added. For performing differential operations SW1 in the D-position and provides current I(=I1=I2) to the diodes D1 and D2 connected in parallel. By this the sum of the currents flowing through Q16/Q17 does not change with the operational mode. In the S-position of switch SW1, current I is led to ground or (not shown) is switched off when in single-ended mode.

Table TAB2 at the bottom of FIG. 9 again shows the various relationships between the involved nodes and components of the comparators and the control signals used to set the comparators to the single-ended or the differential mode of operation.

Figure 10:
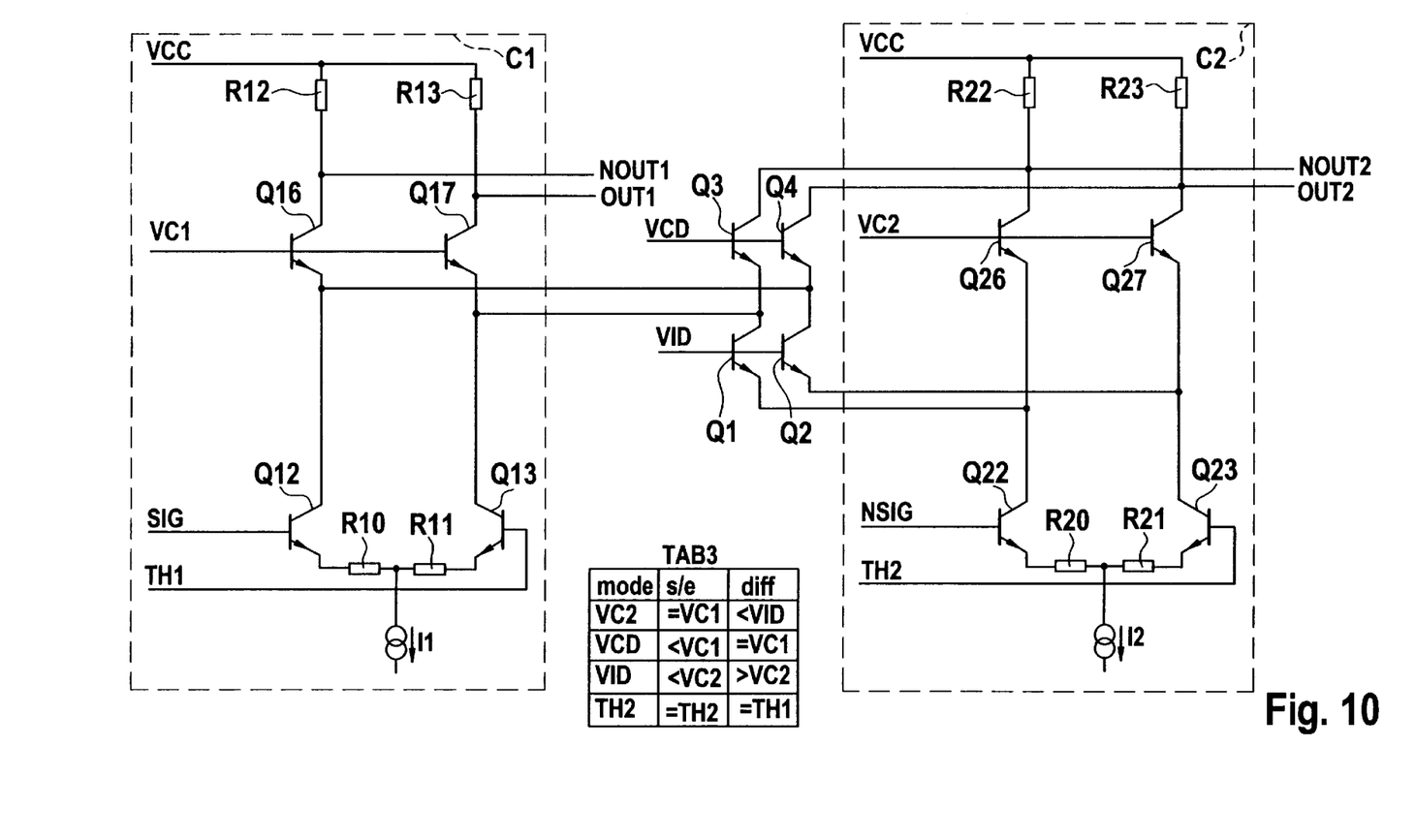

Another sample of the various structures depicted in FIGS. 7a–7f is shown in FIG. 10 that represents a detailed circuit example drawing of the arrangement of FIG. 7e. Basic mode control elements are the control voltages VCD and VID, shown in the middle between comparators C1 and C2 and again in table TAB3 which control transistors Q3/Q4 and Q1/Q2. Transistors Q3 and Q4 together take half of the sum current from Q12,Q13, Q1 and Q2 and feed it to the resistors R23 and R24 at the nodes OUT1 and NOUT1. So, both outputs basically represent the difference signal SIG–NSIG for further processing by subsequent comparator stages.

Figure 11:
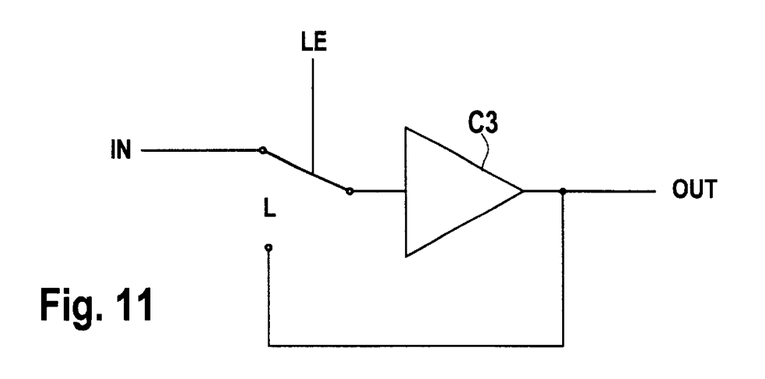

For performing high-speed operations most of the comparators are designed with a built-in latch function which usually results in the highest accuracy when a DUT signal is supposed to be sampled. As shown in FIG. 1 the output signal OUT is kept at the current state by using the latch function, which is independent on the present state of the input signal IN when the transition of a latch enable signal LE occurs. At this moment the input of comparator C3 (see also FIG. 6) is switched to its own output or to a signal directly derived from the output.

Figure 12:
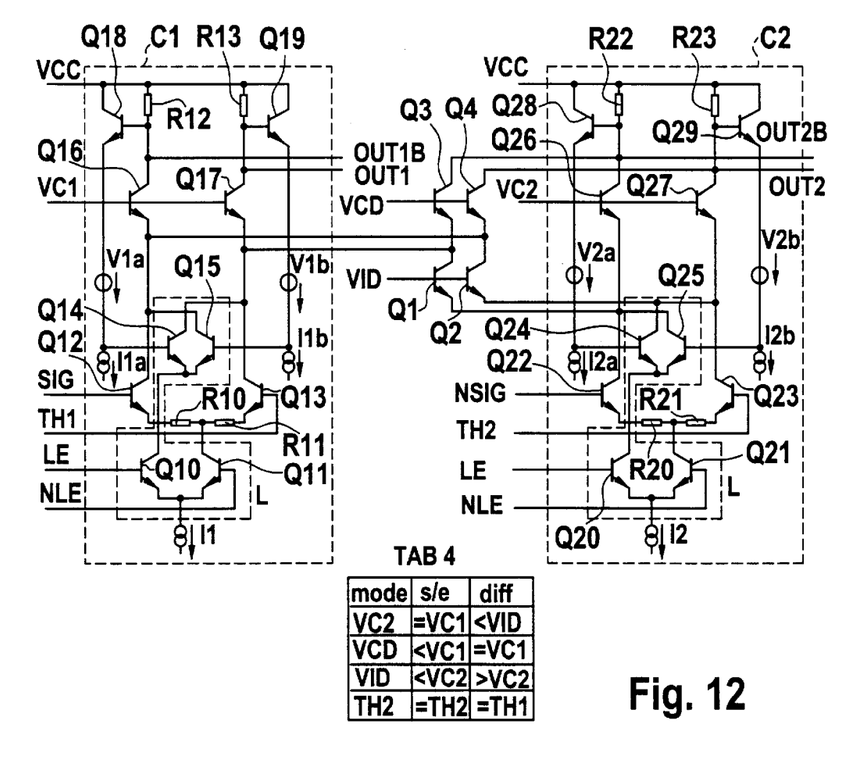

An implemented combination of the circuit of FIG. 10 with the latch function of FIG. 11 is shown in FIG. 12. For latch purposes in connection with comparator C1 a feedback path via Q18, Q19, V1a, Vb, I1a, I1b, Q14 and Q15 is established which is activated when the latch enable signal LE goes high and the complement signal NLE goes low which results in re-routed current flow of I1 from Q11, Q12 and Q13 to Q10, Q14 and Q15. The same measures are taken for implementing the latch function within comparator C2. This technique of built-in latch functions is already known for high-speed comparators.

The basic idea of how to combine both comparator types by using transistors Q1, Q2, Q3 and Q4 also works with an implemented latch function. Since the current distribution between Q16, Q17 and Q3, Q4 is equal when in differential mode, the resulting voltages and therefore the feedback characteristic of both comparators is also equal. This results in the desired latch function that is derived from the difference voltage SIG–NSIG.

Due to the circuit conformity of C1 and C2 it is sufficient to describe the details of the latch L only for C1. The details of the latch function incorporated in C2 are the same accordingly.

The latch function L incorporated in C1 (and C2) is shown within the dotted lines. It comprises transistors Q10, Q11, Q14 and Q15. As long as signal LE is low (and NLE is high) transistor Q10 is off (not conductive) and current I1 flows to the differential amplifier comprising transistors Q12 and Q13 and resistors R10 and R11. Since Q10 is off, there is also no current flow from Q14 and Q15 possible so that they do not contribute to the functionality. In this case the comparator is in transparent mode in which any logic input changes are reflected directly at the output.

Figure 13:
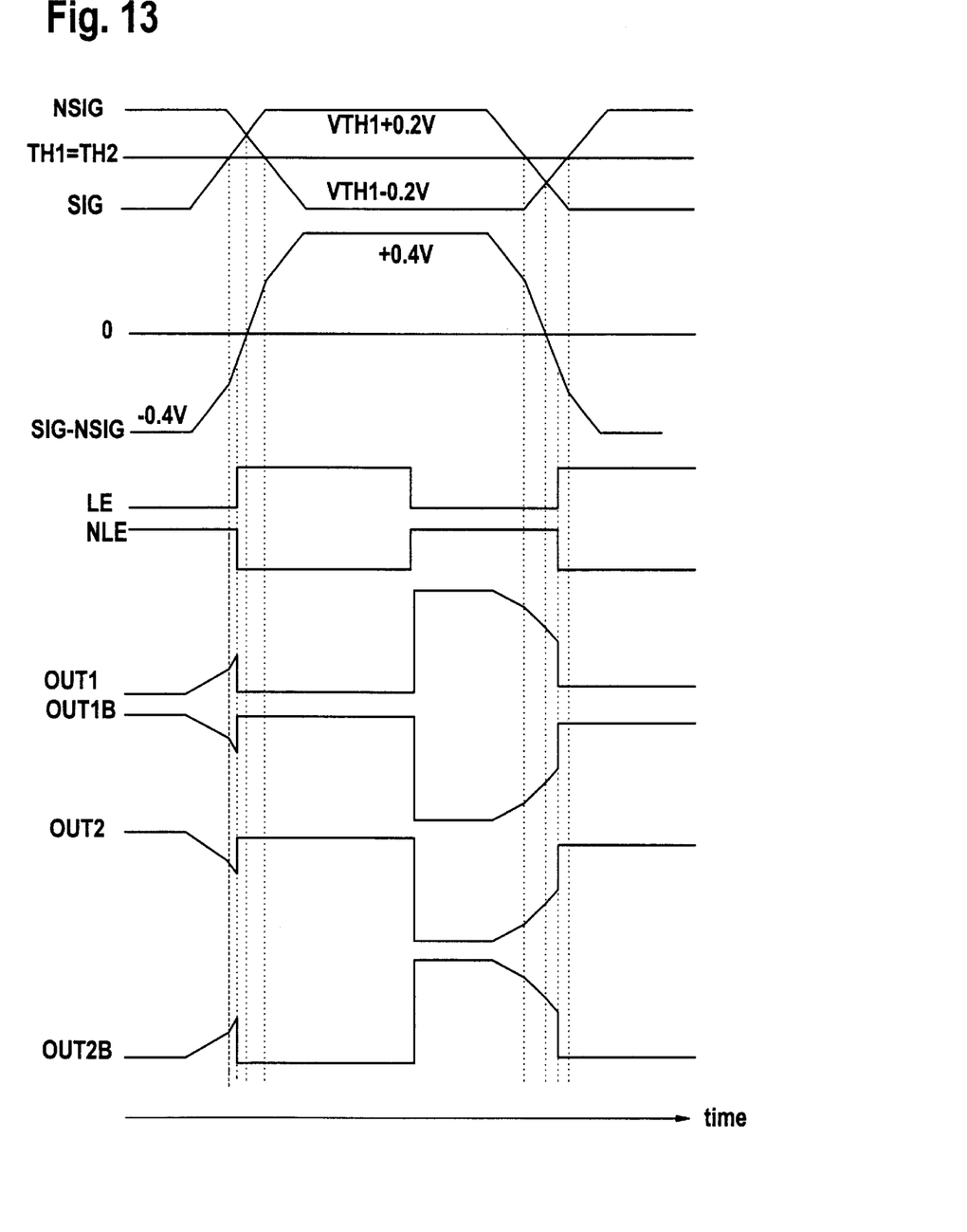

When LE goes high (and NLE goes low) then the current flow I1 is re-routed from the differential amplifier comprising Q12, Q13, R10 and R11 to the amplifier Q14, Q15 which distribute this current in accordance with the difference between the voltages at their base connections, so that a positive feedback occurs which holds OUT1 and OUT2 in their current states. The pulse/time diagram in FIG. 13 shows the control effects of the latch control signals LE and NLE with respect to the latch function incorporated in high-speed comparators as described straight above. Table TAB4 at the bottom of FIG. 12 again shows the essential control signals used for operating the comparator either in single-ended or in differential mode.

Figure 14:
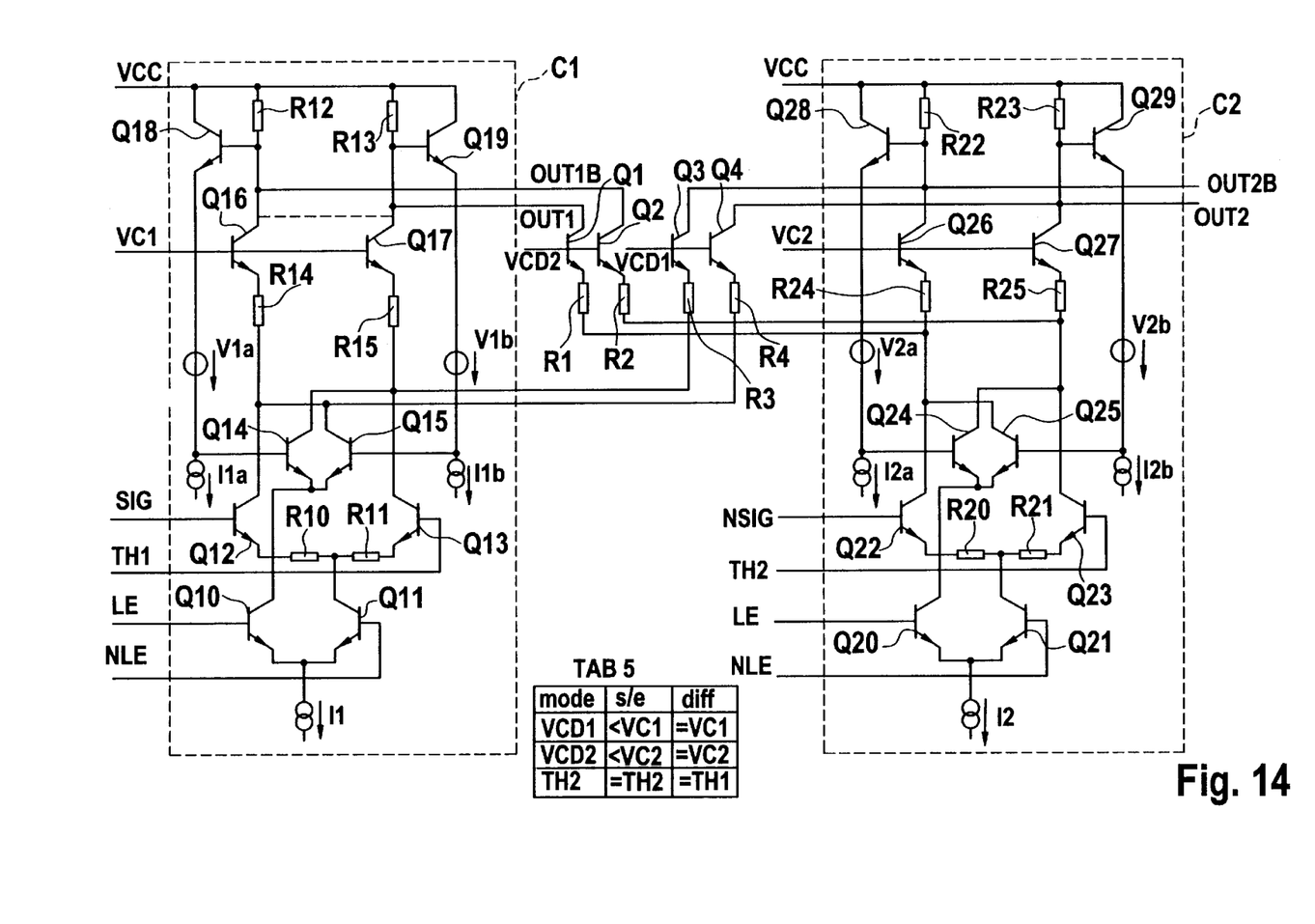

A somewhat simpler circuit arrangement, representing an implementation according to FIG. 7d with latch function incorporated is shown in FIG. 14. The currents of the comparators C1 and C2 are split in equal parts between both of them and the combination takes place directly at the outputs OUT1 (complement OUT1 B) and OUT2 (complement OUT2B).

The resistors R1–R4, R14, R15, R24 and R25 are optional and may be used to distribute the said currents more evenly if the required condition of equal voltages VC1=VCD1 may not exactly be met when, among other reasons the involved semiconductor components differ too much from each other. The switches SW1 and SW2 of FIG. 7d are represented in FIG. 14 by SW1, comprising Q1, Q2, R1, R2, R24, R25 and Q26, Q27 and by SW2, comprising Q3, Q4, R3, R4, R14, R15 and Q16, Q17. The subtractor functions are formed in the same way as described with FIG. 8 by subtracting the partial currents resulting in SIGOUT1–NSIGOUT1 at OUT1 and NSIGOUT1–SIGOUT1 at OUT2. Table TAB 5 at the bottom of FIG. 14 again shows the essential control elements used for switching from single-ended to differential mode of operation.

What is claimed is:

1. A circuit for providing a logical output signal in accordance with crossing points of a differential signal, whereby the logical output signal has a first logical level and a second logical level, the differential signal comprises a normal input signal, and a complementary input signal as the complementary signal to the normal input signal, and the crossing points occur when the normal input signal and the complementary input signal have the same level, the circuit comprising:

a first amplifier for amplifying a first signal difference between the normal input signal and a first threshold value, and for providing as a first output signal the amplified first signal difference, a second amplifier for amplifying a second signal difference between the complementary input signal and a second threshold value, and for providing as a second output signal, the amplified second signal difference, whereby the first and the second threshold values are set to the same level, a first comparator for providing the first logical level when a third signal difference between the first output signal and the second output signal is greater than a third threshold value, and for providing the second logical level when the third signal difference is smaller than the third threshold value.

2. The circuit according to claim 1, further comprising a second comparator receiving the output of the second amplifier, and a third comparator receiving the output of the first amplifier.

3. The circuit according to claim 1, further comprising a switch and a second comparator, wherein:

in a single-ended mode, the switch couples the output of the first amplifier to the first comparator, and the output of the second amplifier is coupled to the second comparator, so that the first amplifier together with the first comparator provides a first comparator unit for comparing a first single-ended input signal coupled to the input of the first amplifier with the first threshold value, and the second amplifier together with the second comparator provides a second comparator unit for comparing a second single-ended input signal coupled to the input of the second amplifier with the second threshold value, whereby the first and second threshold values can be set to different levels, in a differential mode, the switch couples the outputs of the first and second amplifiers to the first comparator as claimed in claim 1.

4. The circuit according to claim 1, wherein the first amplifier and the second amplifier are each operated in a substantially linear amplification region.

5. The circuit according to claim 4, wherein the working point of the first and second amplifiers is adjusted substantially to the middle of an enlarged linear region of its characteristic curve.

6. The circuit according to claim 1, wherein for compensating level floating of the normal and the complementary input signals, both input signals are added in an adder, subsequently divided by two in a divider and used as the first and the second threshold values.

7. The circuit according to claim 1, wherein the third signal difference is provided by a subtractor receiving first and second output signals.

8. The circuit according to claim 1, further comprising a latch function for keeping the logical output signal at a defined temporal state and independent of the present state of the differential signal.

* * * * *